(12) United States Patent
Chang et al.

(10) Patent No.: US 12,308,078 B2
(45) Date of Patent: May 20, 2025

(54) ONE-TIME PROGRAMMABLE (OTP) MEMORY AND METHOD OF OPERATING THE SAME

(71) Applicant: Taiwan Semiconductor Manufacturing Company Limited, Hsinchu (TW)

(72) Inventors: Kuo-Pin Chang, Hsinchu (TW); Kuo-Ching Huang, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 206 days.

(21) Appl. No.: 17/737,259

(22) Filed: May 5, 2022

(65) Prior Publication Data

US 2023/0360711 A1    Nov. 9, 2023

(51) Int. Cl.
*G11C 17/00* (2006.01)
*G11C 13/00* (2006.01)
*G11C 17/16* (2006.01)

(52) U.S. Cl.
CPC ......... *G11C 17/16* (2013.01); *G11C 13/0004* (2013.01); *G11C 13/0026* (2013.01); *G11C 13/0028* (2013.01); *G11C 13/004* (2013.01); *G11C 13/0069* (2013.01)

(58) Field of Classification Search
CPC . G11C 17/16; G11C 13/0004; G11C 13/0026; G11C 13/0028; G11C 13/004; G11C 13/0069
USPC .......................................................... 365/96
See application file for complete search history.

(56) References Cited

U.S. PATENT DOCUMENTS

| 7,961,507 | B2 * | 6/2011 | Liu .................... H10N 70/8825 |
| | | | 365/100 |
| 8,711,532 | B2 | 4/2014 | Pfennigstorf et al. |
| 8,913,415 | B2 * | 12/2014 | Chung ................... H10B 63/20 |
| | | | 365/194 |
| 9,245,648 | B1 | 1/2016 | Li et al. |
| 10,127,992 | B2 | 11/2018 | Chung |
| 10,290,348 | B1 * | 5/2019 | Nardi ................... H10B 63/845 |
| 2006/0097342 | A1 * | 5/2006 | Parkinson ............. H10B 63/80 |
| | | | 257/528 |
| 2007/0053230 | A1 | 3/2007 | Kanno |

FOREIGN PATENT DOCUMENTS

CN            111199766 A        5/2020

OTHER PUBLICATIONS

TW Patent and Trademark Office; TW Application No. 112112375; Office Action mailed Feb. 21, 2024; 18 pages.

* cited by examiner

*Primary Examiner* — Tha-O H Bui
(74) *Attorney, Agent, or Firm* — The Marbury Law Group, PLLC

(57) ABSTRACT

A one-time programmable (OTP) memory includes a plurality of bit lines, a plurality of word lines, and a plurality of memory cells, each memory cell of the plurality of memory cells including a first terminal coupled to a bit line of the plurality of bit lines, a second terminal coupled to a word line of the plurality of word lines, and a selector coupled between the first terminal and the second terminal and having a threshold voltage that is alterable by an electric current.

20 Claims, 19 Drawing Sheets

Table 1. Write Operation - Forming Step ($Vg<Vth2<Vth1<2Vg$)

|  | Selected Cell 102C | Unselected Cell 102A | Unselected Cell 102B | Unselected Cell 102D |
|---|---|---|---|---|
| WL | Vg | Vg | GND | GND |
| BL | -Vg | GND | -Vg | GND |
| Bias | 2Vg | Vg | Vg | GND |
| Form? | Yes | No | No | No |

Table 2. Write Operation - Setting Step ($Vg,set<Vth2<2Vg,set<Vth1$)

|  | Selected Cell 102C | Unselected Cell 102A | Unselected Cell 102B | Unselected Cell 102D |
|---|---|---|---|---|
| WL | Vg,set | Vg,set | GND | GND |
| BL | -Vg,set | GND | -Vg,set | GND |
| Bias | 2Vg,set | Vg,set | Vg,set | GND |
| Set? | Yes | No | No | No |

Table 3. Read Operation ($Vth2<Vr<Vth1$)

|  | Selected Cell 102C | Unselected Cell 102A | Unselected Cell 102B | Unselected Cell 102D |
|---|---|---|---|---|
| WL | Vr | Vr | GND | GND |
| BL | -Vr | GND | -Vr | GND |
| Bias | 2Vr | Vr | Vr | GND |
| Read? | Yes | No | No | No |

FIG. 2D

ONE-TIME PROGRAMMABLE (OTP) MEMORY AND METHOD OF OPERATING THE SAME

BACKGROUND

An one-time-programmable (OTP) memory may be programmed once for permanent storage of data in a semiconductor device. An OTP memory may include, for example, an electrical fuse (eFuse). An eFuse may provide a reduced resistance upon programming.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2D is a summary of the conditions on the memory array during the write operation and read operation, according to one or more embodiments.

DETAILED DESCRIPTION

Figure 1A:
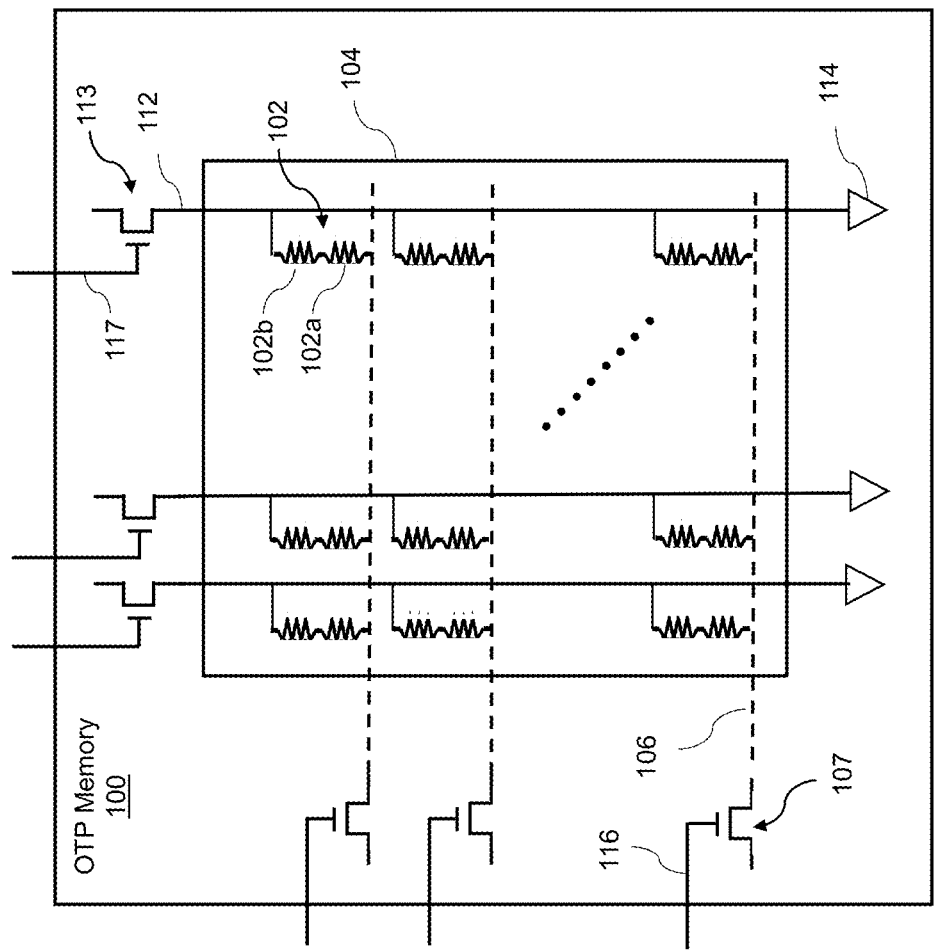
FIG. 1A is a schematic diagram of an OTP memory (e.g., 3D-stackable high-density eFuse memory), according to one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

A related one-time programmable (OTP) memory may include a plurality of memory cells. Each of the plurality of memory cells may include one transistor and one resistive element (1T1R memory cells). The transistor (T) and a resistive element (R) may be coupled in series. The resistive element may include a polysilicon resistor or a metal resistor. The transistor may provide a high current to program the resistive element, and may inhibit (e.g., prevent) generation of a leakage current when the memory cell is not selected.

However, the transistor in each of the memory cells may need to be large, so that the current provided by the transistor is sufficiently high (e.g., about 100 µA) to program the resistive element. Therefore, the related OTP memory may have a low density, and may be hard to be downscaled. Further, a polysilicon resistor is often used in situations in which the related OTP memory is designed to have a three-dimensional (3D) structure (i.e., the memory cells being stacked). The low density and use of a polysilicon resistor may degrade the characteristics of the related OTP memory and increase a cost of the OTP memory. Therefore, it may be undesirable to stack the memory cells in the related OTP memory.

Various embodiments disclosed herein may be directed to OTP memory and methods of operating OTP memory. Various embodiment OTP memory may include a plurality of memory cells. Each of the plurality of memory cells may include one selector and one resistive element (1S1R memory cells), or one selector (1S memory cells).

Each of the memory cells may be initially in a logic "0" state, and may be switched to a logic "1" state by performing a write operation thereon. The OTP memory may have a plurality of memory cells with a high density. The plurality of memory cells may be stackable so as to provide a three-dimensional configuration. Various embodiment OTP memory may be fabricated together with an existing memory device in a process, so that no extra masks may be needed. Various embodiment OTP memory may also have a large sensing window and provide good reliability.

Various embodiment OTP memory may be used as an eFuse memory of a chip and, in particular, to store global information of the chip. The OTP memory may also be used as an information block of a memory device and, in particular, to store information dedicated to the memory device. The OTP memory may include a plurality of bit lines, a plurality of word lines, a plurality of memory cells, a plurality of bit line switches, a plurality of word line switches and a plurality of sense amplifiers.

In one or more embodiments, each of the plurality of memory cells may include a 1S1R memory cell. The 1S1R memory cell may include a first terminal that may be coupled to a corresponding one of the bit lines, and a second terminal that may be coupled to a corresponding one of the word lines. The memory cells may also include a selector (S) and a resistive element (R) that may be coupled in series between the first and second terminals of the memory cell. The selector may have a threshold voltage that is initially at a first threshold value, and that can be decreased to a second threshold value. The selector may include, for example, an ovonic threshold switch (OTS) or a diode. The resistive element may have a variable resistance. The resistive element may include, for example, a phase change random access memory (PCRAM) data storage material, a resistive random access memory (RRAM) data storage material, a ferroelectric random access memory (FeRAM) data storage material or a conductive bridging random access memory (CBRAM) data storage material. The selector may cooperate with the resistive element to store data. The selector may inhibit (e.g., prevent) generation of a leakage current when the memory cell is not selected.

Various embodiment methods for operating the OTP memory may include a write operation and a read operation. The write operation may be performed on each memory cell that is to be switched to the logic "1" state. The read operation is performed on each memory cell that is to be sensed by a sense amplifier.

In embodiments in which the memory cells include 1S1R memory cells, the write operation may include a forming step of supplying a first write voltage (Vg1) and a second write voltage (Vg2) respectively to the first and second terminals of a selected memory cell, so as to decrease the threshold voltage of the selector of the selected memory cell from the first threshold value (Vth1) to the second threshold value (Vth2), where a difference between the first write voltage and second write voltage (|Vg1-Vg2|) may be greater than the first threshold value (Vth1).

The write operation may also include a setting step of supplying a third write voltage (Vg,set1) and a fourth write voltage (Vg,set2) respectively to the first terminal and second terminal of the selected memory cell, so as to cause the resistive element of the selected memory cell to be in a low resistance state, where a difference between the third write voltage and fourth write voltage (|Vg,set1-Vg,set2|) may be smaller than the first threshold value (Vth1) and greater than the second threshold value (Vth2). A time interval between the execution of the forming step and the execution of the setting step may be zero or non-zero.

The read operation may include a step of supplying a first read voltage (Vr1) and a second read voltage (Vr2) respectively to the first and second terminals of a selected memory cell, so that the logic state of the selected memory cell can be sensed. A difference between the first and second read voltages (|Vr1-Vr2|) may be less than the first threshold value (Vth1) and greater than the second threshold value (Vth2).

In various embodiments, the OTP memory (e.g., including 1S1R memory cells) may provide several advantages over a related OTP memory. The memory cells may, for example, have a vertical structure and a small cell area (e.g., minimum cell size) of $4F^2$, where "F" is a feature size of the memory cell (e.g., a width of the selector). In one or more embodiments, the cell area may be in a range of from 5 nm×5 nm to 50 nm×50 nm. Therefore, the OTP memory may have a high density. The memory cells may also be respectively located at intersections of the word lines and the bit lines, and may be stacked, so that the OTP memory has a 3D cross-point structure.

The OTP memory may include an eFuse memory of a semiconductor device (e.g., semiconductor memory device) including associated memory that is associated with the eFuse memory. For example, the 1S1R memory cells of the OTP memory may be similar in structure to the memory cells of the associated memory of the semiconductor device. That is, the 1S1R memory cells of the OTP memory may be similar to the 1S1R memory cells of the semiconductor chip or memory device including the OTP memory (e.g., the PCRAM, the RRAM, the FeRAM or the CBRAM). Therefore, for example, when resistive elements of the OTP memory and resistive elements of the existing memory device are made of the same material, the OTP memory may be fabricated together with the existing memory device while no extra masks are needed.

For each of the memory cells (e.g., 1S1R memory cells), when the memory cell is being read, a current flowing through the memory cell may be on the order of pA if the memory cell is in the logic "0" state, and is on the order of µA if the memory cell is in the logic "1" state. Therefore, the OTP memory may have a large sensing window. For each memory cell that is in the logic "0" state, the selector may be very stable since it is in a fresh state. For each memory cell that is in the logic "1" state, On/OFF switching of the selector may be irrelevant to reliability, and the resistive element may be very stable since it may be in the low resistance state. Therefore, the OTP memory may have a good reliability.

One or more embodiments (e.g., embodiments having 1S1R memory cells) may include an alternative write operation. The alternative write operation may include a combined forming and setting step of supplying a first write voltage (Vg1) and a second write voltage (Vg2) to the first and second terminals of a selected memory cell, so as to decrease the threshold voltage of the selector of the selected memory cell from the first threshold value (Vth1) to the second threshold value (Vth2) and cause the resistive element of the selected memory cell to be in the low resistance state, where a difference between the first and second write voltages (|Vg1-Vg2|) is greater than the first threshold value (Vth1). An execution time of the forming and setting step in this alternative write operation may be longer than an execution time of the forming step in the first write operation described above.

In one or more embodiments, the memory cells may include a 1S memory cell (e.g., a 1S-only memory cell). As with embodiments including the 1S1R memory cells, where the OTP memory includes 1S memory cells, the OTP memory may include an eFuse memory of a semiconductor device (e.g., semiconductor memory device) including associated memory that is associated with the eFuse memory. For example, the 1S memory cells of the OTP memory may be similar in structure to the memory cells of the associated memory of the semiconductor device. In particular, the OTP memory may be used as an eFuse memory of a chip, and used to store global information of the chip. The OTP memory may also be used as an information block of a memory device (e.g., associated memory), and used to store information dedicated to the memory device. The OTP memory in the third embodiment may also include a plurality of bit lines, a plurality of word lines, a plurality of memory cells, a plurality of bit line switches, a plurality of word line switches and a plurality of sense amplifiers.

The 1S memory cells may include a first terminal that may be coupled to a corresponding one of the bit lines, a second terminal that may be coupled to a corresponding one of the word lines, and a selector (S) that may be coupled between the first and second terminals of the memory cell. The selector may have a threshold voltage that may be initially at a first threshold value, and that can be decreased to a second threshold value. The selector may also include an ovonic threshold switch (OTS) or a diode. The selector may store data, and may inhibit (e.g., prevent) generation of a leakage current when the memory cell is not selected. For each memory cell, the memory cell may be initially in a logic "0" state, and may be switched to a logic "1" state by performing a write operation thereon.

It should be noted that the OTP memory in the present disclosure may be distinguished from a phase change memory at least in the fact the OTP memory (e.g., eFuse memory) may be used for data storage and/or code storage, whereas a phase change memory may include a kind of high-density array for "storage" memory application. For example, the device specification for the OTP memory (e.g., eFuse memory) may be different in terms of cycles, power and reliability than the device specifications for the phase change memory.

An embodiment method for operating the OTP memory having 1S memory cells may include a write operation and a read operation. The write operation may be performed on each memory cell that is to be switched to the logic "1" state. The read operation may be performed on each memory cell that is to be sensed by a sense amplifier.

The write operation for the OTP memory having 1S memory cells may include a forming step of supplying a first write voltage (Vg1) and a second write voltage (Vg2) respectively to the first and second terminals of a selected memory cell, so as to decrease the threshold voltage of the selector of the selected memory cell from the first threshold value (Vth1) to the second threshold value (Vth2), where a difference between the first and second write voltages (|Vg1-Vg2|) may be greater than the first threshold value (Vth1).

The read step for the OTP memory having 1S memory cells may include a step of supplying a first read voltage (Vr1) and a second read voltage (Vr2) respectively to the first and second terminals of a selected memory cell, so that the logic state of the selected memory cell can be sensed, where a difference between the first and second read voltages (|Vr1-Vr2|) may be smaller than the first threshold value (Vth1) and greater than the second threshold value (Vth2).

FIG. 1A is a schematic diagram of an OTP memory 100 (e.g., 3D-stackable high-density eFuse memory), according to one or more embodiments. As illustrated in FIG. 1, the OTP memory 100 may include a memory array 104 including a plurality of memory cells 102 that may be arranged in rows and columns. In at least one embodiment, the memory cells 102 may include one-time programmable (OTP) memory cells. The memory cells 102 may include 1S1R memory cells having a selector 102a and a resistive element 102b arranged in series. In at least one embodiment, the selector 102a may include an ovonic threshold switch (OTS) and the resistive element 102b may include a layer of phase change material (PEM) (e.g., chalcogenide material).

The OTP memory 100 may be considered, for example, an electronic fuse (eFuse) memory in which case the memory array 104 may constitute an eFuse array. The memory cells 102 may constitute an eFuse unit in the eFuse array. That is, for example, the selector 102a may constitute a memory element and may prevent a leakage current from unselected cells. The resistive element 102b may constitute an eFuse of the eFuse array.

The memory array 104 may include any suitable number of rows and columns. For example, the memory array 104 may include R number of rows and C number of columns, where R is an integer greater than or equal or one and C is a number greater than or equal to two.

The OTP memory 100 may include a plurality of word lines 106 and a plurality of bit lines 112. A row of the memory cells 102 may be operatively connected to a word line 106 of the plurality of word lines 106. Each of the word lines 106 may be operatively connected to a word line select switch 107. The word line select switches 107 may select a particular word line 106 based on a word line select signal that may be received on a word line select signal line 116. The word line select signal may be generated inside the OTP memory 100 or outside the OTP memory 100. The word line select switches 107 may be included, for example, in a word line select circuit. The word line select switches 107 may include, for example, a transistor (e.g., field effect transistor (FET)).

A column of memory cells 102 may be operatively connected to a bit line 112 of the plurality of bit lines 112. Each of the bit lines 112 may be operatively connected to a bit line select switch 113. The bit line select switches 113 may select a particular bit line 112 based on a bit line select signal that is received on a bit line select signal line 117. The bit line select signal may be generated inside the OTP memory 100 or outside the OTP memory 100. The bit line select switches 107 may be included, for example, in a bit line select circuit. The bit line select switches 107 may also include, for example, a transistor (e.g., field effect transistor (FET)).

A processing device (not shown) may be operatively connected to the memory array 104 and may control an operation (e.g., write operation, read operation, etc.) on the memory array 104. In particular, the processing device may be connected to the word lines 106, word line select switches 107, bit lines 112 and bit line select switches 113. For example, the processing device may generate the word line select signal and bit line select signal. The processing device may include, for example, a central processing unit, a microprocessor, an application specific integrated circuit, a graphics processing unit, a field programmable gate array, or some combination thereof.

A power supply (not shown) may also be operatively connected to the memory array 104 and the processing device. In cooperation with the power supply, the processing device may cause one or more bias voltages to be applied to the memory cells 102 in the memory array 104.

The processing device and/or the power supply may be inside the OTP memory 100 or outside the OTP memory 100. In particular, the processing device and/or the power supply may be disposed in the same circuitry (e.g., the same integrated circuit) as the memory array 104, or the processing device and/or the power supply may be disposed in separate circuitry from the memory array 104 and operatively connected to the memory array 104. The OTP memory 100, the processing device, and the power supply may be included, for example, in an integrated circuit for an electronic device such as a computer, phone, television, camera, and wearable device, etc.

When data is to be written to a memory cell 102 (e.g., the memory cell 102 is to be programmed), or when data is to be read from a memory cell 102, a word line select signal may be received on a word line select signal line 116 for the word line 106 associated with the memory cell 102. The word line select signal may turn ON the word line select switch 107 on the associated word line 106 so as to activate or assert the associated word line 106. In addition, a bit line select signal may be received on a bit line select signal line 117 for the bit line 112 associated with the memory cell 102. The bit line select signal may turn ON the bit line select switch 113 on the associated bit line 112 so as to activate or assert the associated bit line 112. The data may be then written to, or read from, the memory cell 102.

The OTP memory 100 may also include one or more sense amplifiers 114 (e.g., differential amplifiers) connected to the plurality of bit lines 112. When data is to be read from a selected memory cell 102, a voltage may be applied to the word line 106 associated with the selected memory cell 102 and the bit line 112 associated with the selected memory cell 102. This may cause a sensible current (e.g. low voltage signal) to be generated on the bit line 114 associated with the selected memory cell 102. The signal may represent the data (1 or 0) stored in the read memory cell 102. The sense amplifier 114 may sense the signal and amplify the signal.

Figure 1B:
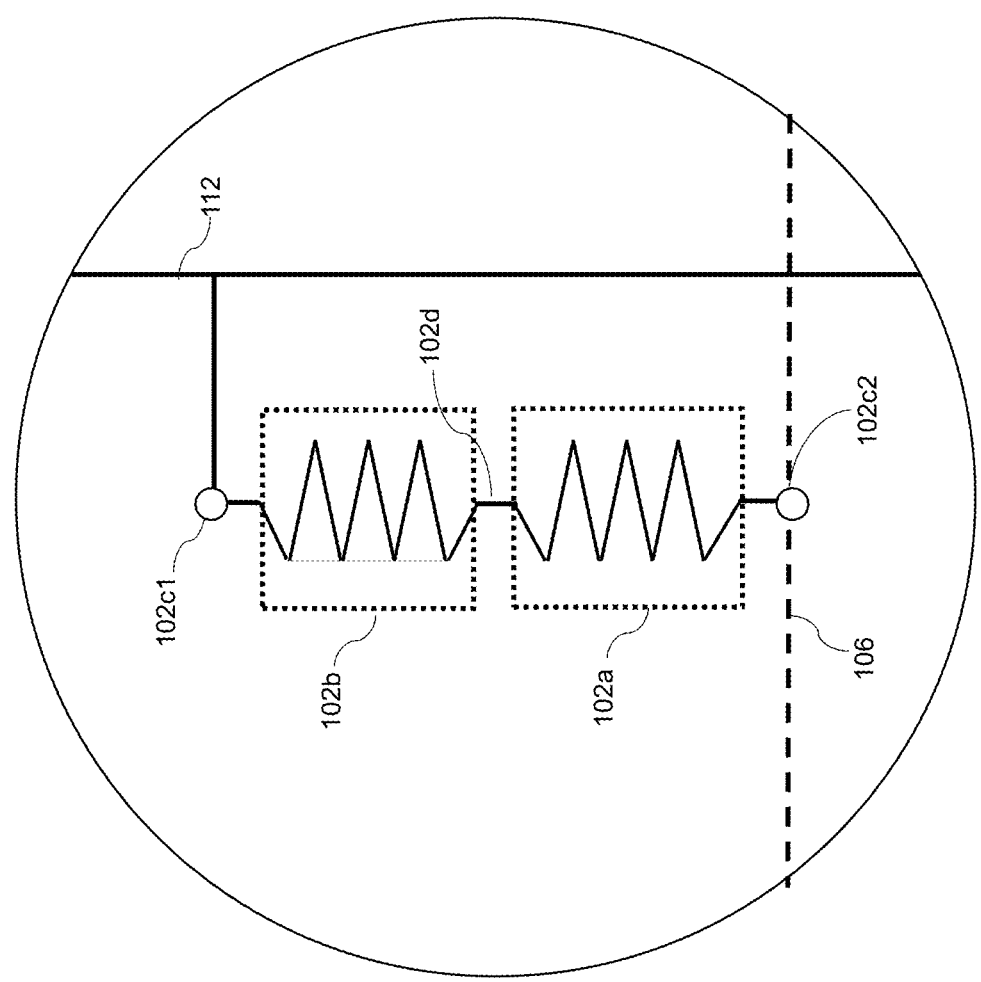
FIG. 1B is a schematic diagram of the memory cell in the OTP memory, according to one or more embodiments.

FIG. 1B is a schematic diagram of the memory cell 102 in the OTP memory 100, according to one or more embodiments. As illustrated in FIG. 1B, the memory cell 102 may include the selector 102a and resistive element 102b arranged in series between a word line 106 and bit line 112.

The memory cell 102 may also include a first terminal 102c1 for connecting (e.g., coupling) the memory cell 102 to the bit line 112. In particular, the first terminal 102c1 may connect the resistive element 102b to the bit line 112. The memory cell 102 may also include a second terminal 102c2 for connecting the memory cell 102 to the word line 106. In particular, the second terminal 102c2 may connect the selector 102a to the word line 106.

The memory cell 102 may also include a connection line 102d that electrically connects the selector 102a to the resistive element 102b. The connection line 102d may include, for example a metal line or metal trace. In at least one embodiment, the connection line 102d may be omitted so that the selector 102a and the resistive element 102b are in direct physical contact. The memory cell 102 may also include other connection lines for connecting the memory cell 102 to the word line 106 and the bit line 112. It should be noted that a connection of the memory cell 102 to the word line 106 and a connection of the memory cell 102 to the bit line 112 do not necessarily require a direct connection.

The selector 102a may be configured to provide an on-state to off-state current ratio (non-linearity), a high on-state current density, a fast switching speed, high endurance cycles, a high thermal stability, ease of process integration, and operational compatibility with a memory element. The selector 102a may have a threshold voltage that is initially at a first threshold value, and that can be decreased to a second threshold value. The selector 102a may include, for example, an ovonic threshold switch (OTS). The OTS may include a phase-change material that can switch between an amorphous phase and a crystalline phase having very different optical and electrical properties. The phase-change material may include, for example, a chalcogenide phase-change material. The selector 102a may alternatively include, for example, a diode, a metal-ion threshold switch, an insulator-metal transition-type selector, and a tunneling barrier-type selector.

The resistive element 102b may have a variable resistance. The resistive element 102b may include, for example, PCRAM data storage material, RRAM data storage material, FeRAM) data storage material or CBRAM data storage material.

The selector 102a may cooperate with the resistive element 102b to store data. The selector 102a may inhibit (e.g., prevent) generation of a leakage current when the memory cell 102 is not selected. Each memory cell 102 may be initially in a logic "0" state, and can be switched to a logic "1" state by performing a write operation thereon.

Figure 1C:
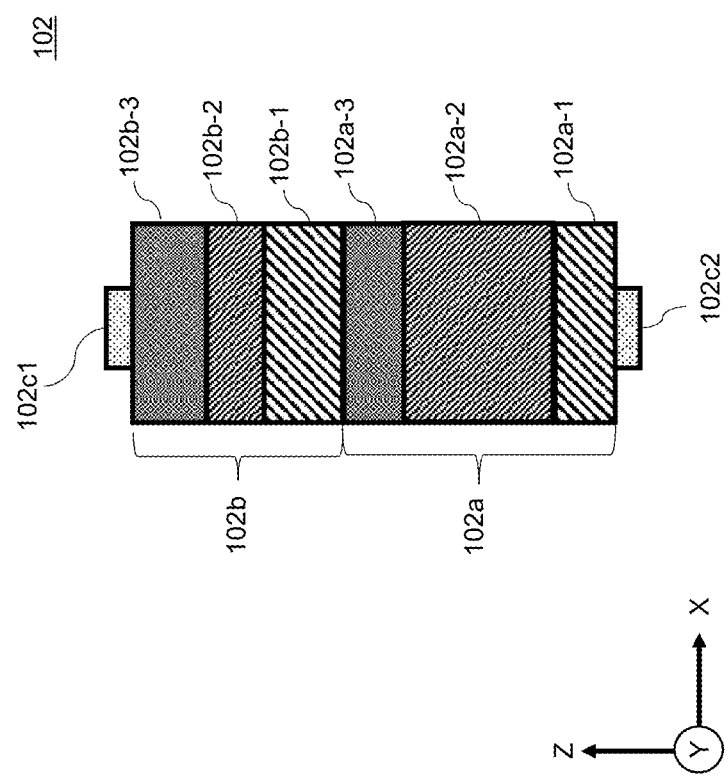
FIG. 1C is a vertical cross sectional view of the memory cell in the OTP memory, according to one or more embodiments.

FIG. 1C is vertical cross sectional view of the memory cell 102 in the OTP memory 100, according to one or more embodiments. As illustrated in FIG. 1C, the memory cell 102 may include the selector 102a that may contact (e.g., directly contact) with the resistive element 102b. The selector 102a may include, for example, an ovonic threshold switch (OTS) including a stack of layers that are layered in the z-direction in FIG. 1C. In particular, the selector 102a may include a lower barrier layer 102a-1 such as a TiN layer, a phase-change material layer 102a-2 (e.g., switching material layer) such as a chalcogenide layer on the lower barrier layer 102a-1, and an upper barrier layer 102a-3 such as a TiN layer on the phase-change material layer 102a-2. The lower barrier layer 102a-1, phase-change material layer 102a-2 and upper barrier layer 102a-3 may be deposited by physical deposition or chemical deposition including, for example, evaporation, ion plating, and sputtering.

The resistive element 102b may include, for example, a stack of layers that, ay be formed (e.g., deposited) on the selector 102a in the z-direction in FIG. 1C. A total thickness of the resistive element 102b in the z-direction may be substantially the same as a total thickness of the selector 102a in the z-direction. In at least one embodiment, the total thickness of the resistive element 102b may be less than the total thickness of the selector 102a.

A width of the resistive element 102b may be substantially the same as a width of the selector 102a (e.g., an area in the x-plane may be substantially the same as an area in the x-y plane of the selector 102a) may be less than a total thickness of the selector 102a in the z-direction. In at least one embodiment, the width of the resistive element 102b may be less than the width of the selector 102a.

Figure 2A:
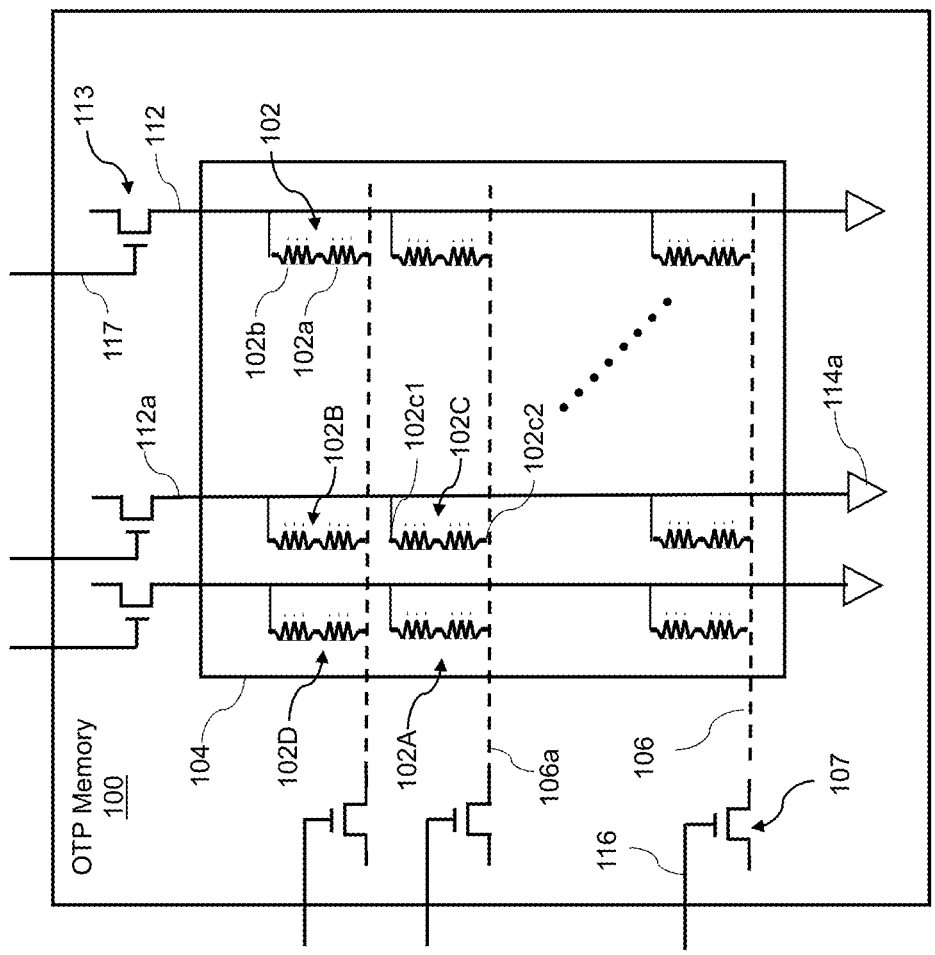
FIG. 2A is a schematic diagram of the OTP memory including a selected memory cell, according to one or more embodiments.
Figure 2B:
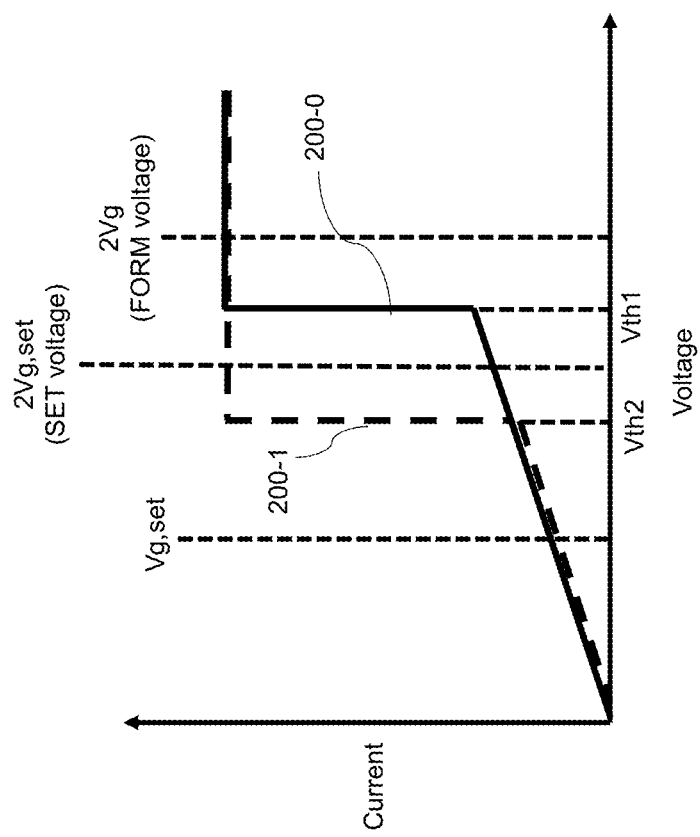
FIG. 2B is a graph plotting voltage vs. current for a write operation in the selected memory cell, according to one or more embodiments.
Figure 2C:
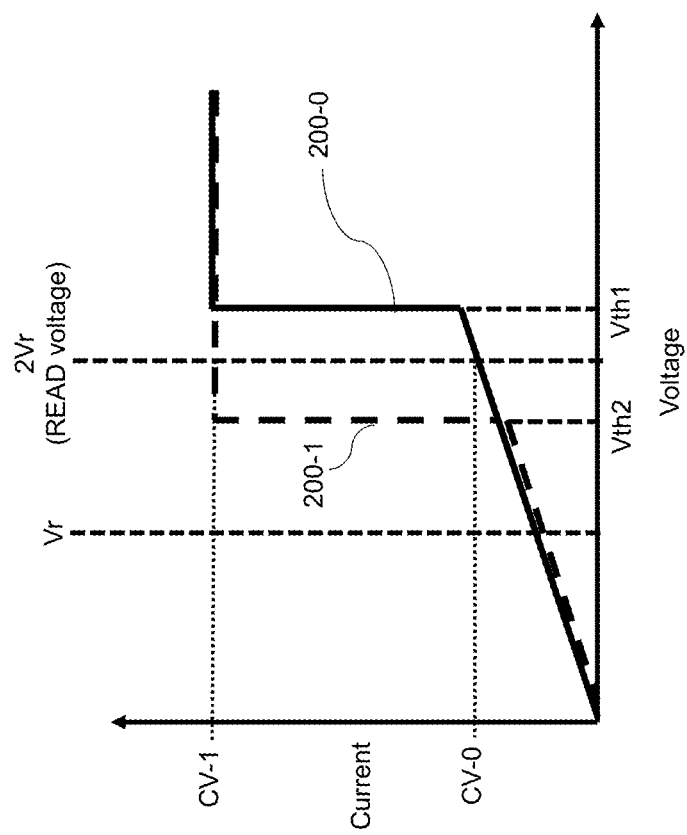
FIG. 2C is a graph plotting voltage vs. current for the read operation in the selected memory cell, according to one or more embodiments.

The resistive element 102b may also include, for example, a stack of layers that are layered in the z-direction in FIG. 2C. In particular, the resistive element 102b may include a lower barrier layer 102*b*-1 such as a TiN layer, and a layer of data storage material 102*b*-2 (e.g., PCRAM data storage material, RRAM data storage material, FeRAM data storage material, CBRAM data storage material, etc.) on the lower barrier layer 102*b*-1. The layer of data storage material 102*b*-2, may include, for example, a phase-change material (PCM) layer or an oxide-based material layer. The resistive element 102*b* may also include an upper barrier layer 102*b*-3 such as a TiN layer on the layer of data storage material 102*b*-2.

The first terminal 102*c*1 of the memory cell 102 may include an upper conductive material layer that is formed on the resistive element 102*b*. The second terminal 102*c*2 of the memory cell 102 may include a lower conductive material layer. The selector 102*a* may be formed on the lower conductive material layer. The lower conductive material layer and upper conductive material layer may include, for example, one or more layers of metals, metal alloys, and/or or other metal-containing compounds (e.g., Cu, Al, Mo, Co, Ru, W, Cr, Ni, Sn, Ti, Ta, Au, TiN, TaN, WN, etc.). Other conductive materials are within the contemplated scope of this disclosure. The lower conductive material layer and upper conductive material layer may be deposited by physical deposition or chemical deposition including, for example, evaporation, ion plating, and sputtering.

Figure 1D:
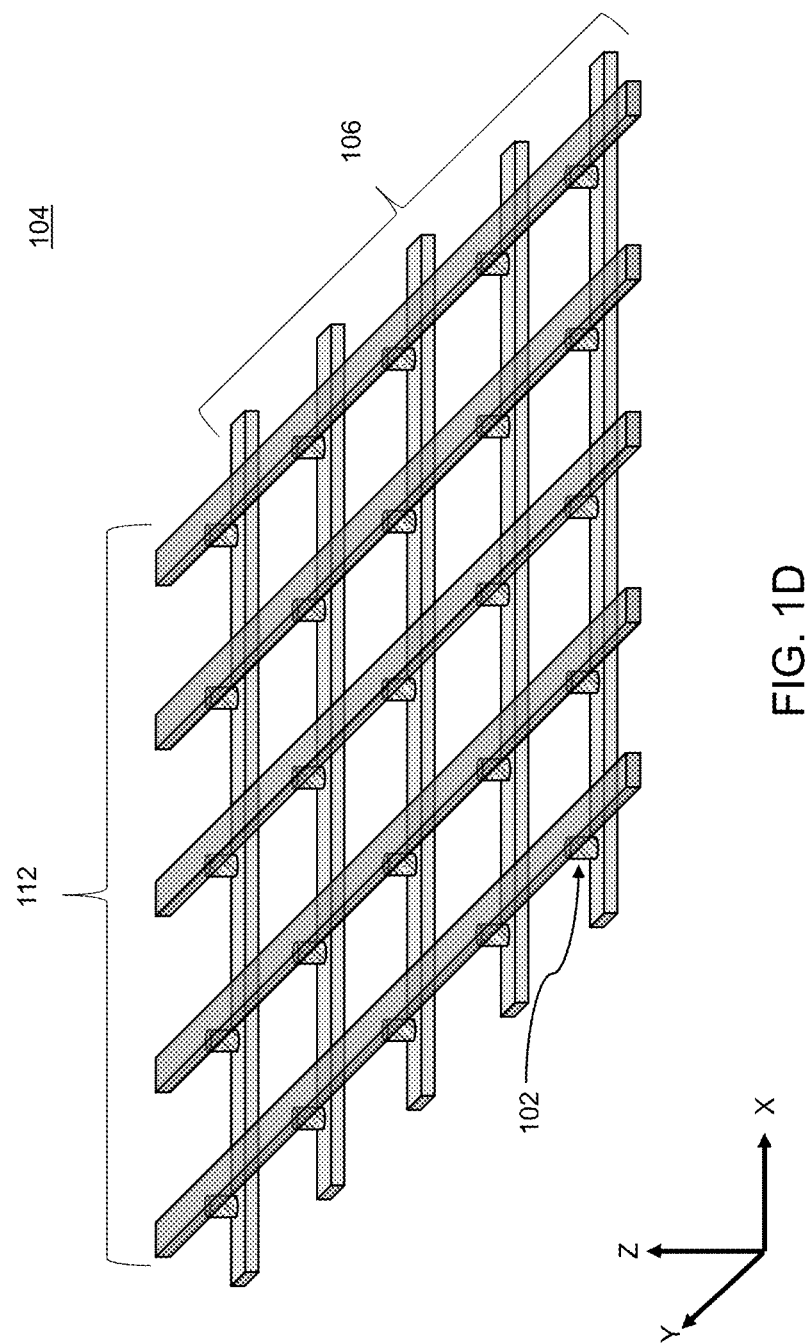
FIG. 1D is a perspective view of the memory array, according to one or more embodiments.

FIG. 1D is a perspective view of the memory array 104, according to one or more embodiments. As illustrated in FIG. 1D, the memory array 104 may include a crosspoint array having a crosshatch design. In particular, the word lines 106 of the memory array 104 may include a plurality of metal lines or metal traces that are arranged in y-direction of FIG. 1D. The word lines 106 may be formed, for example, on a dielectric layer (not shown).

The memory cells 102 may be formed on the word lines 106 so that the second terminal 102*c*2 of the memory cell 102 contacts an upper surface of the word lines 106. The bit lines 112 of the memory array 104 may include a plurality of metal lines or metal traces that are arranged in x-direction of FIG. 1D. The bit lines 112 may be formed on the memory cells 102 so that the bit lines 112 contact the first terminal 102*c*1 of the memory cell 102. One or more of the word lines 106, memory cells 102 and bit lines 112 may be embedded in one or more layers of dielectric material which are not shown in FIG. 1D for ease of explanation.

The word lines 106 and bit lines 112 may include, for example, one or more layers of metals, metal alloys, and/or or other metal-containing compounds (e.g., Cu, Al, Mo, Co, Ru, W, Cr, Ni, Sn, Ti, Ta, Au, TiN, TaN, WN, etc.). Other conductive materials are within the contemplated scope of this disclosure. The word lines 106 and bit lines 112 may be deposited by physical deposition or chemical deposition including, for example, evaporation, ion plating, and sputtering.

A method of operating the OTP memory 100 (e.g., having 1S1R memory cells) may include a write operation and a read operation. The write operation may be performed on each of the memory cells 102 that is to be switched to the logic "1" state. The read operation may be performed on each of the memory cells 102 that is to be sensed by the sense amplifier 114.

FIG. 2A illustrates the OTP memory 100 including a selected memory cell 102C, according to one or more embodiments. FIG. 2B is a graph plotting voltage vs. current for a write operation in the selected memory cell 102C, according to one or more embodiments. FIG. 2C is a graph plotting voltage vs. current for the read operation in the selected memory cell 102C, according to one or more embodiments.

In FIG. 2A, the memory cells 102 (e.g., 1S1R memory cells) may include the selected memory cell 102C that has been selected for the write operation. The write operation may include a forming step of supplying a first write voltage (Vg1) via the bit line 112*a* to the first terminal 102*c*1 of the selected memory cell 102C, and supplying a second write voltage (Vg2) via the word line 106*a* to the second terminal 102*c*2 of the selected memory cell 102C. As a result, a threshold voltage of the selector 102*a* of the selected memory cell 102C may be decreased from a first threshold value (Vth1) to a second threshold value (Vth2). In at least one embodiment, the first threshold value (Vth1) may be in a range from about 2.5V to about 4.5V, and the second threshold value (Vth2) may be in a range from about 0.1V to about 1.8V.

FIG. 2B illustrates the decrease in threshold value resulting from the forming step. The graph in FIG. 2B illustrates a voltage-current profile 200-0 for the selected memory cell 102C in a "0" state (e.g., before the forming step). The graph also illustrates a voltage-current profile 200-1 for the selected memory cell 102C in a "1" state (e.g., after the forming step). As further illustrated in FIG. 2B, a difference between the first write voltage Vg1 and second write voltage Vg2 (|Vg1-Vg2|) may be greater than the first threshold value (Vth1).

The write operation may also include a setting step of supplying a third write voltage (Vg,set1) to the first terminal 102*c*1 of the selected memory cell 102C, and supplying a fourth write voltage (Vg,set2) to the second terminal 102*c*2 of the selected memory cell 102C, so as to cause the resistive element 102*b* of the selected memory cell 102C to be in a low resistance state (e.g., a phase-change material of the resistive element 102*b* is in a SET state). As illustrated in FIG. 2B, a difference between the third write voltage Vg,set1 and the fourth write voltage Vg,set2 (|Vg,set1-Vg,set2|) may be less than the first threshold value (Vth1) and greater than the second threshold value (Vth2).

In particular, a resistance of the resistive element 102*b* before the setting step of the write operation may be in a high resistance state that may be from about 100,000 ohm to 10 million ohm. A resistance of the resistive element 102*b* after the setting step of the write operation may be in a low resistance state that may be from about 10 ohm to about 1000 ohm.

For example, the following may be satisfied: Vg1=Vg>0; Vg2=-Vg<0; |Vg1-Vg2|=2×Vg>Vth1; Vg,set1=Vg,set>0; Vg,set2=-Vg,set<0; and Vth2<|Vg,set1-Vg,set2|=2×Vg, set<Vth1. A time interval between the execution of the forming step and the execution of the setting step may be zero or non-zero.

It should be noted that the unselected memory cells 102 in the memory array 104 may be unaffected by the write operation. For example, assume that prior to the write operation, memory cell 102A is in a "0" state, and memory cell 102B is in a "1" state. Memory cell 102A is on the word line 106*a* but will not be formed or set because the Vg bias and Vg,set bias is less than the first threshold voltage (Vth1). Memory cell 102B which is on the bit line 112*a* has been formed (i.e., the selector 102*a* in memory cell 102B has the second threshold voltage (Vth2)) but during the setting step for memory cell 102C, the bias is only Vg,set which is less than Vth2. Therefore, the selector 102*a* (e.g., the OTS) in memory cell 102B can't be turned ON.

Referring to FIG. 2C, the read operation may include a step of supplying a first read voltage (Vr1) via the bit line 112a to the first terminal 102c1 of the selected memory cell 102C, and supplying a second read voltage (Vr2) via the word line 106a to the second terminal 102c2 of the selected memory cell 102C, so that the logic state of the selected memory cell 102C can be sensed by the sense amplifier 114a. As illustrated in FIG. 2C, the difference between the first read voltage Vr1 and the second read voltage Vr2 (|Vr1-Vr2|) may be less than the first threshold value (Vth1) and greater than the second threshold value (Vth2). For example, the following may be satisfied: Vr1=Vr>0; Vr2=−Vr<0; and Vth2<|Vr1-Vr2|=2×Vr<Vth1.

Thus, as illustrated in FIG. 2C, before the forming step, the selected memory cell 102C is in a "0" state and the sense amplifier 114a may sense a current having a current value of CV-0. However, after the forming step, the selected memory cell 102C is in a "1" state and the sense amplifier 114a may sense a current having a current value of CV-1 which may be significantly greater than the current value CV-0.

It should be noted that the unselected memory cells 102 in the memory array 104 may be unaffected by the read operation. The READ voltage (e.g., 2Vr) for reading the selected memory cell 102C may be greater than Vth2 so that the selector 102a is turned ON and passes a high current to the sense amplifier 114a for sensing. Memory cell 102A (in "0" state) is on the word line 106a but only sees a voltage Vr (not 2Vr) which is less than Vth1, and therefore the selector 102a (e.g., OTS) in memory cell 102A will remain OFF. Memory cell 102B (in "1" state) sees a voltage Vr which is less than Vth2, and therefore, the selector 102a (e.g., OTS) in memory cell 102B will remain OFF.

In general, in the read operation, a current flowing through a memory cell 102 may be on the order of pA if the memory cell 102 is in the logic "0" state, and may be on the order of μA if the memory cell 102 is in the logic "1" state. That is, a value of the current sensed when the memory cell 102 is in the "1" state may be at least 106 times a value of the current sensed when the memory cell 102 is in the "0" state. Therefore, the OTP memory 100 may have a large sensing window (e.g., the difference between CV-0 and CV-1). If the memory cell 102 is in the logic "0" state, the selector 102a of the memory cell 102 may be very stable since it is in a fresh state. If the memory cell 102 is in the logic "1" state, ON/OFF switching of the selector 102a may be irrelevant to reliability, and the resistive element 102b may be very stable since it may be in the low resistance state. Therefore, the OTP memory 100 may have a good reliability.

The embodiment OTP memory 100 (e.g., having 1S1R memory cells) may provide several advantages over a related OTP memory. The memory cells 102 in the OTP memory 100 may, for example, have a vertical structure (e.g., see FIG. 2C) and a small cell area (e.g., minimum cell size) of $4F^2$, where "F" is a feature size of the memory cell 102 (e.g., a width of the selector 102a). In one or more embodiments, the cell area (e.g., in the x-y plane in FIG. 2C) may be in a range of from about 5 nm×5 nm to about 50 nm×50 nm. Therefore, the OTP memory 100 may have a high density of memory cells 102. The OTP memory 100 may also have a greater chip efficiency than a related 1T1R eFuse memory.

FIG. 2D is a summary of the conditions on the memory array 102 during the write operation and read operation, according to one or more embodiments. In particular, Table 1 in FIG. 2D summarizes the conditions in memory cells 102A-102D during the forming step of the write operation. Table 2 summarizes the conditions in memory cells 102A-102D during the setting step of the write operation. Table 3 summarizes the conditions in memory cells 102A-102D during the read operation.

The OTP memory 100 may also use an alternative write operation that may be different from the write operation described above with reference to FIG. 2B. The alternative write operation may include a combined forming and setting step of supplying a first write voltage (Vg1) to the first terminal 102c1 and supplying a second write voltage (Vg2) to the second terminal 102c2 of the selected memory cell 102C, so as to decrease the threshold voltage of the selector 102a of the selected memory cell 102C from the first threshold value (Vth1) to the second threshold value (Vth2) and cause the resistive element 102b of the selected memory cell 102C to be in the low resistance state. In this alternative write operation, a difference between the first write voltage and second write voltage (|Vg1-Vg2|) may be greater than the first threshold value (Vth1). For example, the following may be satisfied: Vg1=Vg>0, Vg2=−Vg<0, and |Vg1-Vg2|=2×Vg>Vth1. An execution time of the combined forming and setting step in this alternative write operation may be longer than an execution time of the forming step of the write operation described above with reference to FIG. 2B.

Figure 2E:
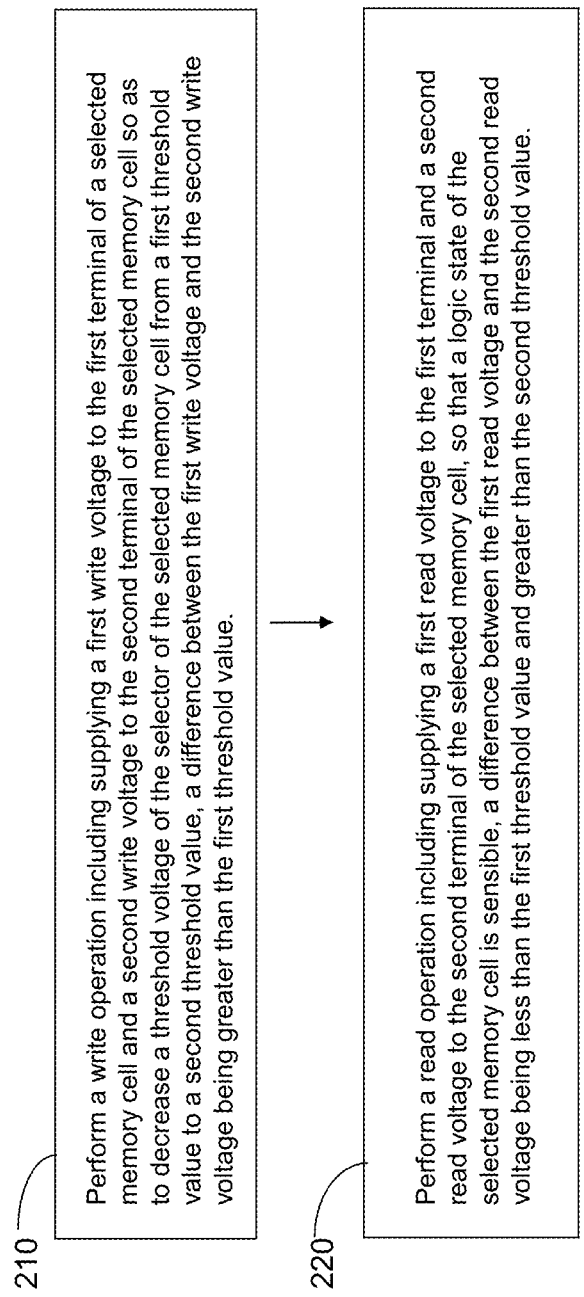
FIG. 2E is a flowchart of operations of a method of operating the OTP memory, according to one or more embodiments.

FIG. 2E illustrates a method of operating the OTP memory 100, according to one or more embodiments. The method of operating the OTP memory 100 may include a Step 210 of performing a write operation including supplying a first write voltage to the first terminal of a selected memory cell and a second write voltage to the second terminal of the selected memory cell so as to decrease a threshold voltage of the selector of the selected memory cell from a first threshold value to a second threshold value, a difference between the first write voltage and the second write voltage being greater than the first threshold value.

The method may further include a Step 220 of performing a read operation including supplying a first read voltage to the first terminal and a second read voltage to the second terminal of the selected memory cell, so that a logic state of the selected memory cell is sensible, a difference between the first read voltage and the second read voltage being less than the first threshold value and greater than the second threshold value.

The performing of the read operation in Step 220 may further include sensing (e.g., using a sense amplifier 114) a current in a bit line of the OTP memory generated by the supplying of the first read voltage to the first terminal and the second read voltage to the second terminal. In addition, the Step 210 of performing the write operation may further include supplying a third write voltage to the first terminal and a fourth write voltage to the second terminal, so as to cause the resistive element of the selected memory cell to be in a low resistance state. A difference between the third write voltage and the fourth write voltage may be less than the first threshold value and greater than the second threshold value. Further, in the Step 210 of performing the write operation, the supplying of the first write voltage to the first terminal of a selected memory cell and the second write voltage to the second terminal of the selected memory cell may cause the resistive element of the selected memory cell to be in a low resistance state.

Figure 3:
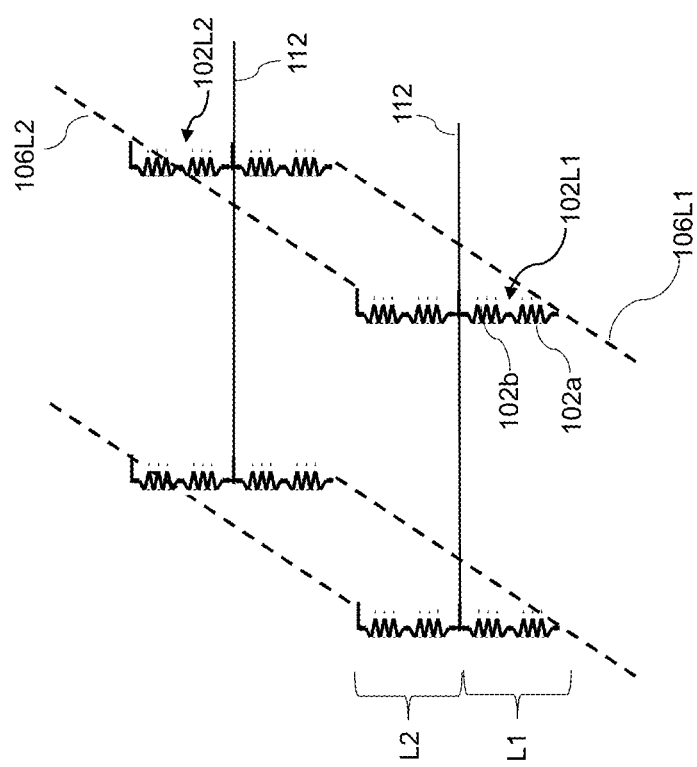
FIG. 3 illustrates an alternative design of memory array in the OTP memory, according to one or more embodiments.
Figure 3:
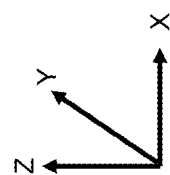

FIG. 3 illustrates an alternative design of memory array 104 in the OTP memory 100, according to one or more embodiments. In the alternative design, the memory array 104 may include a plurality of levels L1, L2 stacked in the z-direction in FIG. 3, so that the memory array 104 may have a three-dimensional (3D) cross-point structure. Although only two levels are illustrated in FIG. 3, the memory array 104 in the first alternative design may include any number of levels greater than one.

In particular, the first level L1 of the memory array 104 may include a plurality of memory cells 102L1 (first level memory cells). A memory cell 102L1 of the plurality of memory cells 102L1 may include the resistive element 102b stacked on the selector 102a in the z-direction in FIG. 3. The memory cells 102L1 may be respectively located at intersections of the word lines 106L1 and the bit lines 112. In particular, the plurality of word lines 106L1 may extend in the y-direction and the plurality of bit lines 112 may extend in the x-direction. The second level L2 of the memory array 104 may have a structure that is substantially similar to a structure of the first level L1. In particular, the second level L2 may include a plurality of memory cells 102L2 (second level memory cells) that are stacked in the z-direction on the plurality of memory cells 102L1. The second level L2 may also include a plurality of word lines 106L2 extending in the y-direction and the plurality of bit lines 112 extending in the x-direction.

Figure 4A:
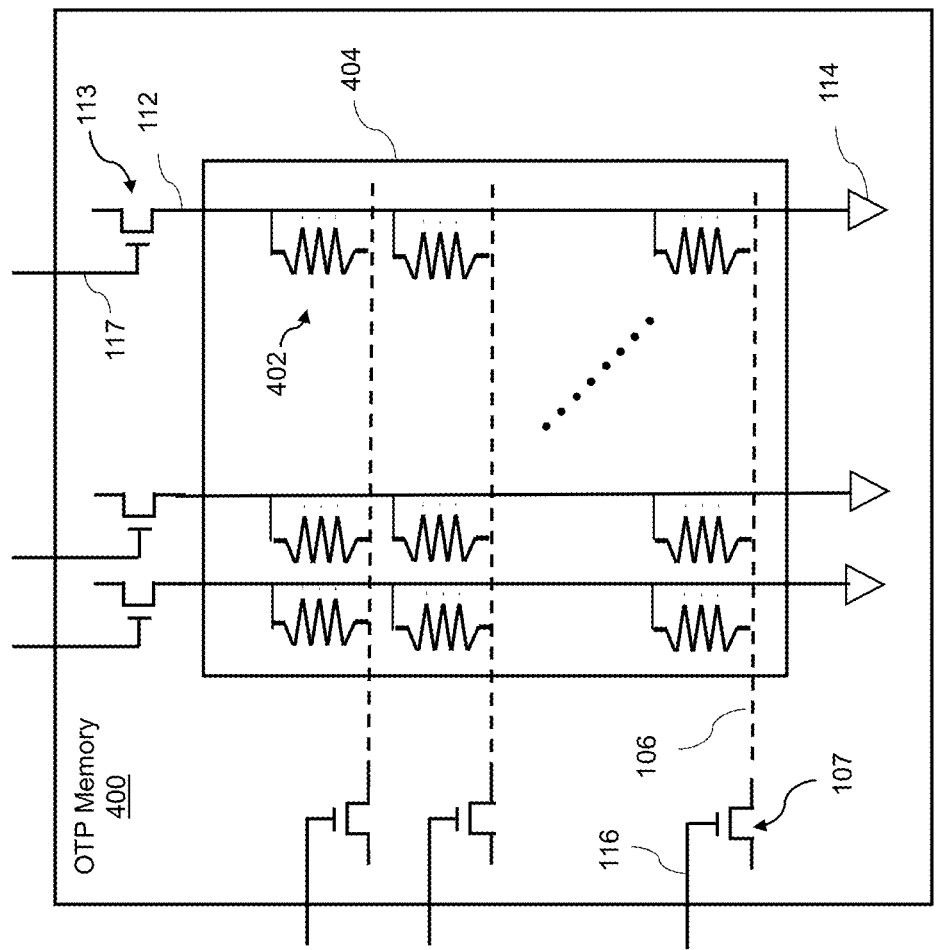
FIG. 4A is a schematic diagram of the OTP memory including a memory array, according to one or more embodiments.

FIG. 4A illustrates an embodiment OTP memory 400 including a memory array 404, according to one or more embodiments. The OTP memory 400 in FIG. 4A may be substantially the same as the OTP memory 100 except that the OTP memory 400 includes memory array 404. As illustrated in FIG. 4A, the memory array 404 may include a plurality of memory cells 402 that may include the selector 102a (e.g., a plurality of 1S memory cells).

Figure 4B:
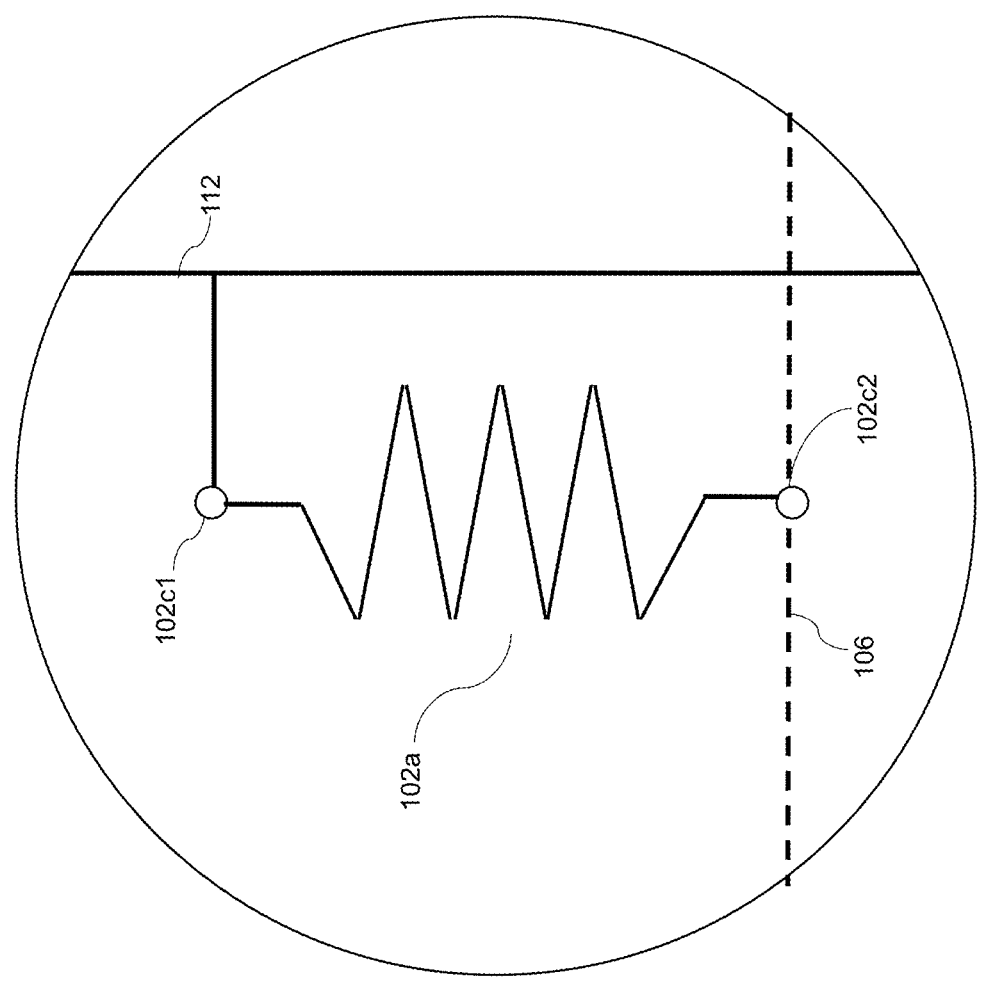
FIG. 4B is a schematic diagram of the memory cell in the second alternative design of the memory array, according to one or more embodiments.

FIG. 4B is a schematic diagram of the memory cell 402 in the second alternative design of the memory array 404, according to one or more embodiments. As illustrated in FIG. 4B, the memory cells 402 may include the selector 102a. That is, in contrast to the memory cells 102, the memory cells 402 may not necessarily include a resistive element.

The first terminal 102c1 of the memory cell 402 may connect (e.g., couple) the selector 102a to the bit line 112. The second terminal 102c2 of the memory cell 402 may connect the selector 102a to the word line 106. The memory cell 402 may also include connection lines (e.g., metal lines or metal traces) for connecting the selector 102a to the word line 106 and the bit line 112. It should be noted that a connection of the memory cell 402 to the word line 106 and a connection of the memory cell 402 to the bit line 112 do not necessarily require a direct connection.

The selector 102a may be the same as described above with respect to the memory cell 102. Therefore, the description of the selector 102a above is incorporated herein by reference. In short, the selector 102a may store data and inhibit (e.g., prevent) generation of a leakage current when the memory cell 402 is not selected. Each memory cell 402 may be initially in a logic "0" state, and can be switched to a logic "1" state by performing a write operation thereon.

Figure 4C:
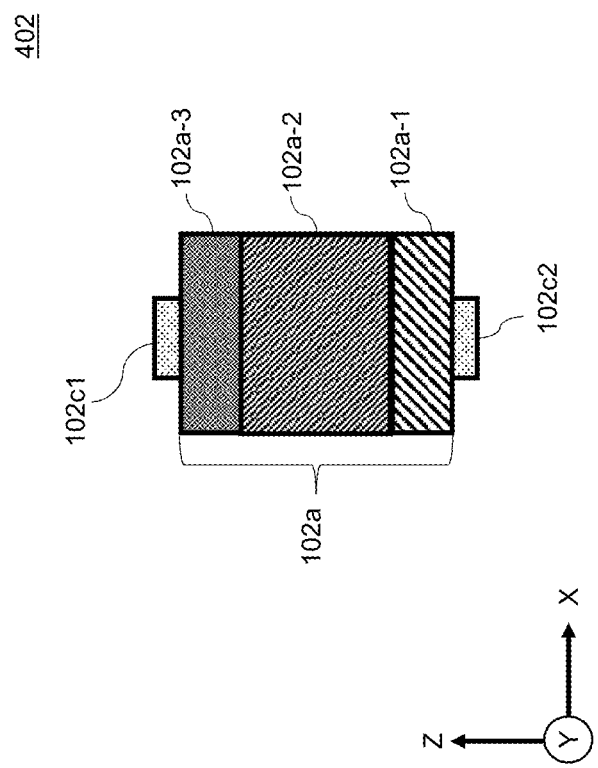
FIG. 4C is a vertical cross sectional view of the memory cell in the OTP memory, according to one or more embodiments.

FIG. 4C is a vertical cross sectional view of the memory cell 402 in the OTP memory 400, according to one or more embodiments. As illustrated in FIG. 4C, the selector 102a in the memory cell 402 may include, for example, an ovonic threshold switch (OTS) including the lower barrier layer 102a-1, the phase-change material layer 102a-2 such as a chalcogenide layer on the lower barrier layer 102a-1, and the upper barrier layer 102a-3 on the phase-change material layer 102a-2. The first terminal 102c1 of the memory cell 402 may include an upper conductive material layer that is formed on the upper barrier layer 102a-3. The lower barrier layer 102a-1 of the selector 102a may be formed on a lower conductive material layer of the second terminal 102c2.

The memory cell 402 may be formed, for example, in substantially the same manner and using substantially the same materials as the memory cell 102. The memory array 404 may be formed, for example, in substantially the same manner and using substantially the same materials as the memory array 104 (e.g., see FIG. 1D).

As with the memory cells 102 (1S1R memory cells), a write operation may be performed on each of the memory cells 402 (1S memory cells) that is to be switched to the logic "1" state. Further, as with memory cells 102, the read operation may be performed on each of the memory cells 402 that is to be sensed by the sense amplifier 114.

However, a method of operating the OTP memory 400 with the plurality of memory cells 402 (1S memory cells) may be different than the method of operating the OTP memory 100 with the plurality of memory cells 102 (1S1R memory cells). In particular, the memory array 404 including the memory cells 402 may perform a write operation and a read operation differently than the memory array 104 including the memory cells 102.

Figure 5A:
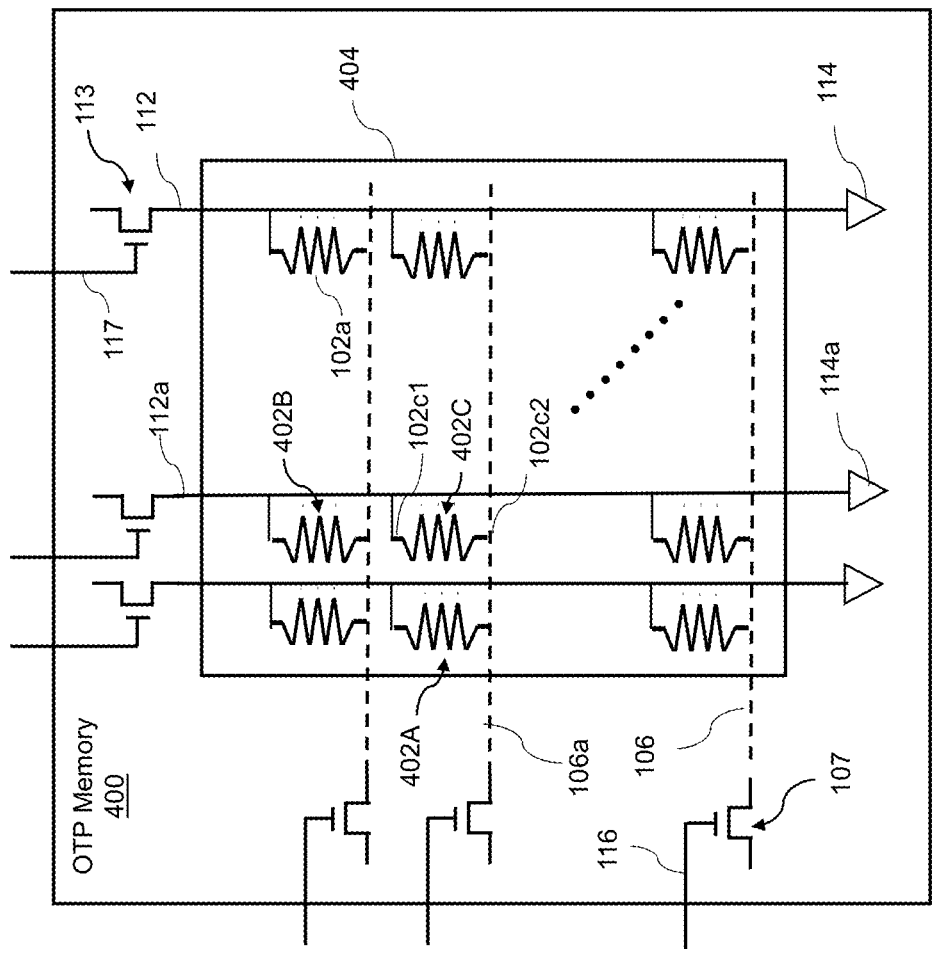
FIG. 5A is a schematic diagram of the OTP memory including a selected memory cell, according to one or more embodiments.
Figure 5B:
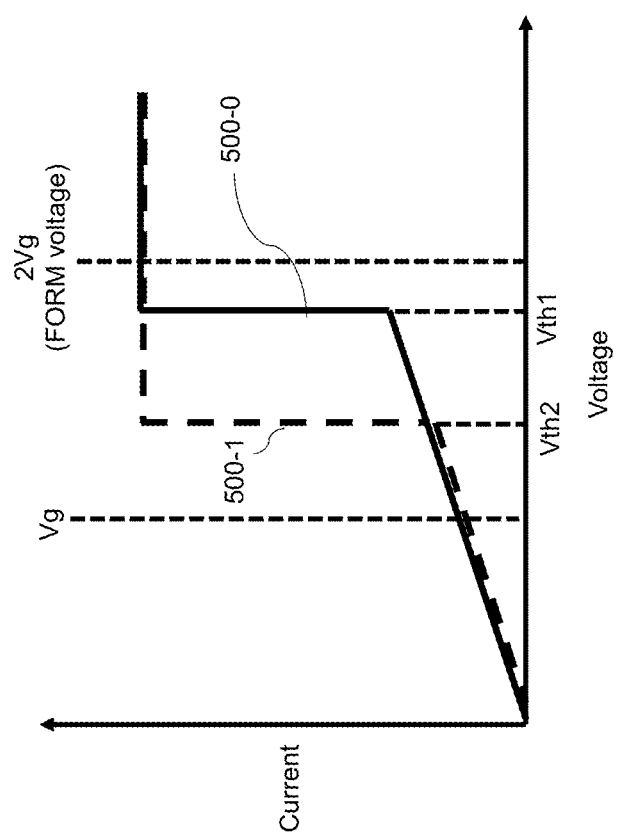
FIG. 5B is a graph plotting voltage vs. current for a write operation in the selected memory cell, according to one or more embodiments.
Figure 5C:
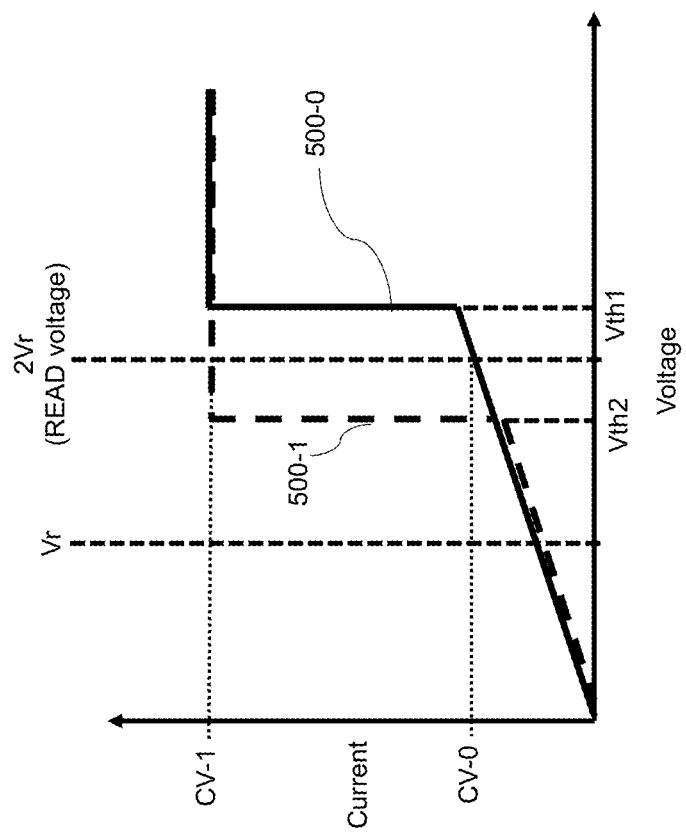
FIG. 5C is a graph plotting voltage vs. current for the read operation in the selected memory cell, according to one or more embodiments.

FIG. 5A illustrates the OTP memory 400 including a selected memory cell 402C, according to one or more embodiments. FIG. 5B is a graph plotting voltage vs. current for a write operation in the selected memory cell 402C, according to one or more embodiments. FIG. 5C is a graph plotting voltage vs. current for the read operation in the selected memory cell 402C, according to one or more embodiments.

In FIG. 5A, the memory cells 402 (e.g., 1S memory cells) may include the selected memory cell 402C that has been selected for the write operation. The write operation may include a forming step of supplying a first write voltage (Vg1) via the bit line 112a to the first terminal 102c1 of the selected memory cell 402C, and supplying a second write voltage (Vg2) via the word line 106a to the second terminal 102c2 of the selected memory cell 402C. As a result, a threshold voltage of the selector 102a of the selected memory cell 402C may be decreased from a first threshold value (Vth1) to a second threshold value (Vth2). In at least one embodiment, the first threshold value (Vth1) may be in a range from about 2.5V to about 4.5V, and the second threshold value (Vth2) may be in a range from about 0.1V to about 1.8V.

FIG. 5B illustrates the decrease in threshold value resulting from the forming step. The graph in FIG. 5B illustrates a voltage-current profile 500-0 for the selected memory cell 402C in a "0" state (e.g., before the forming step). The graph also illustrates a voltage-current profile 500-1 for the selected memory cell 402C in a "1" state (e.g., after the forming step). As further illustrated in FIG. 5B, a difference between the first write voltage Vg1 and the second write voltage Vg2 ($|Vg1-Vg2|$) may be greater than the first threshold value (Vth1). For example, the following may be satisfied: $Vg1=Vg>0$, $Vg2=-Vg<0$, and $|Vg1-Vg2|=2\times Vg>Vth1$.

Referring to FIG. 5C, the read operation may include a step of supplying a first read voltage (Vr1) via the bit line 112a to the first terminal 102c1 of the selected memory cell 402C, and supplying a second read voltage (Vr2) via the word line 106a to the second terminal 102c2 of the selected memory cell 402C, so that the logic state of the selected memory cell 402C can be sensed by the sense amplifier 114a. As illustrated in FIG. 5C, the difference between the first read voltage Vr1 and the second read voltage Vr2 ($|Vr1-Vr2|$) may be less than the first threshold value (Vth1)

and greater than the second threshold value (Vth2). For example, the following may be satisfied: Vr1=Vr>0; Vr2=−Vr<0; and Vth2<|Vr1-Vr2|=2×Vr<Vth1.

Thus, as illustrated in FIG. 5C, before the forming step, the selected memory cell 402C is in a "0" state and the sense amplifier 114a may sense a current having a current value of CV-0. However, after the forming step, the selected memory cell 402C is in a "1" state and the sense amplifier 114a may sense a current having a current value of CV-1 which may be significantly greater than the current value CV-0 Thus, as illustrated in FIG. 5C, before the forming step, the selected memory cell 402C is in a "0" state and the sense amplifier 114a may sense a current having a current value of CV-0. However, after the forming step, the selected memory cell 402C is in a "1" state and the sense amplifier 114a may sense a current having a current value of CV-1 which may be significantly greater than the current value CV-0.

It should be noted that the unselected memory cells 402 in the memory array 404 may be unaffected by the write operation. For example, assume that prior to the write operation, memory cell 102a is in a "0" state, and memory cell 402B is in a "1" state. Memory cell 102a is on the word line 106a but will not be formed because the Vg bias is less than the first threshold voltage (Vth1). Thus, the threshold voltage of memory cell 102a will remain Vth1. Memory cell 402B which is on the bit line 112a has been formed (i.e., the selector 102a in memory cell 402B has the second threshold voltage (Vth2)) but during the forming step for memory cell 402C, the bias voltage on memory cell 402B is only Vg which is less than Vth2. Therefore, the selector 102a (e.g., the OTS) in memory cell 402B will not be turned ON in the forming step.

It should also be noted that the unselected memory cells 402 in the memory array 404 may be unaffected by the read operation. The READ voltage (e.g., 2Vr) for reading the selected memory cell 402C may be greater than Vth2 so that the selector 102a is turned ON in memory cell 402C and passes a high current to the sense amplifier 114a for sensing. Memory cell 102a (in "0" state) is on the word line 106a but only sees a voltage Vr (not 2Vr) which is less than Vth1, and therefore the selector 102a (e.g., OTS) in memory cell 102a will remain OFF. Memory cell 402B (in "1" state) sees a voltage Vr which is less than Vth2, and therefore, the selector 102a (e.g., OTS) in memory cell 402B will remain OFF.

In general, in the read operation, a current flowing through a memory cell 402 may be on the order of pA if the memory cell 402 is in the logic "0" state, and may be on the order of pA if the memory cell 402 is in the logic "1" state. That is, a value of the current sensed when the memory cell 102 is in the "1" state may be at least 106 times a value of the current sensed when the memory cell 102 is in the "0" state. Therefore, the OTP memory 400 may have a large sensing window (e.g., the difference between CV-0 and CV-1). If the memory cell 402 is in the logic "0" state, the selector 102a of the memory cell 402 may be very stable since it is in a fresh state. If the memory cell 402 is in the logic "1" state, ON/OFF switching of the selector 102a may be irrelevant to reliability. Therefore, the OTP memory 400 may have a good reliability.

Like the OTP memory 100, the OTP memory 400 may provide several advantages over a related OTP memory. The memory cells 402 in the OTP memory 400 may, for example, have a vertical structure and a small cell area (e.g., minimum cell size) of $4F^2$, where "F" is a feature size of the memory cell 402 (e.g., a width of the selector 102a). In one or more embodiments, the cell area (e.g., in the x-y plane in FIG. 4C) may be in a range of from about 5 nm×5 nm to about 50 nm×50 nm. Therefore, the OTP memory 400 may have a high density of memory cells 402. The OTP memory 400 may also have a greater chip efficiency than a related 1T1R eFuse memory.

Figure 6:
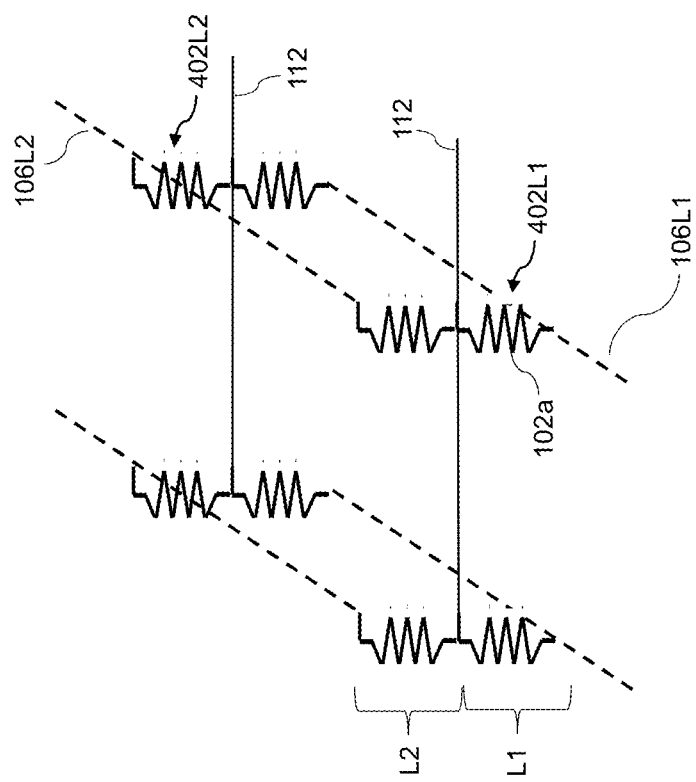
FIG. 6 illustrates an alternative design of memory array in the OTP memory, according to one or more embodiments.

FIG. 6 illustrates an alternative design of memory array 404 in the OTP memory 400, according to one or more embodiments. In the alternative design, the memory array 404 may include a plurality of levels L1, L2 stacked in the z-direction in FIG. 6, so that the memory array 404 may have a three-dimensional (3D) cross-point structure. Although only two levels are illustrated in FIG. 6, the memory array 604 in the first alternative design may include any number of levels greater than one.

In particular, the first level L1 of the memory array 404 may include a plurality of memory cells 402L1 (first level memory cells). A memory cell 402L1 of the plurality of memory cells 402L1 may include the selector 102a extending in the z-direction in FIG. 6. The memory cells 402L1 may be respectively located at intersections of the word lines 106L1 and the bit lines 112. In particular, the plurality of word lines 106L1 may extend in the y-direction and the plurality of bit lines 112 may extend in the x-direction. The second level L2 of the memory array 404 may have a structure that is substantially similar to a structure of the first level L1. In particular, the second level L2 may include a plurality of memory cells 402L2 (second level memory cells) that are stacked in the z-direction on the plurality of memory cells 402L1. The second level L2 may also include a plurality of word lines 106L2 extending in the y-direction and the plurality of bit lines 112 extending in the x-direction.

Figure 7:
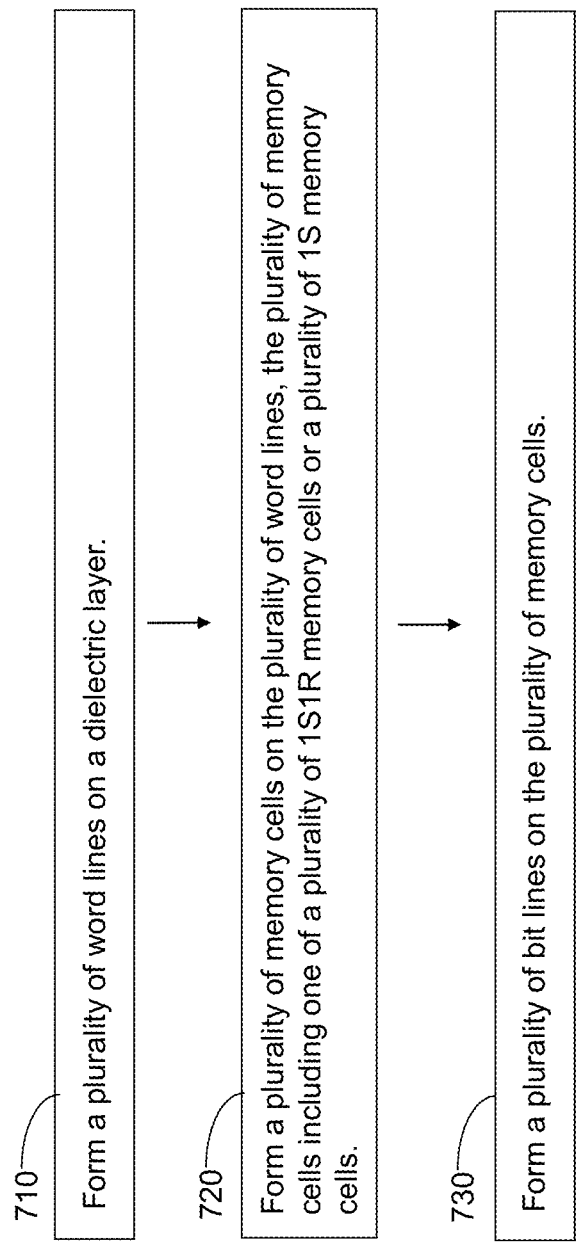
FIG. 7 is a flow chart illustrating a method of forming a memory array of an OTP memory, according to one or more embodiments.

FIG. 7 is a flow chart illustrating a method of forming a memory array (e.g., memory array 104 or memory array 404) of an OTP memory, according to one or more embodiments. The method may include a Step 710 of forming a plurality of word lines on a dielectric layer. Step 720 of the method may include forming a plurality of memory cells on the plurality of word lines, the plurality of memory cells including one of a plurality of 1S1R memory cells or a plurality of 1S memory cells. Step 730 of the method may include forming a plurality of bit lines on the plurality of memory cells.

Figure 8B:
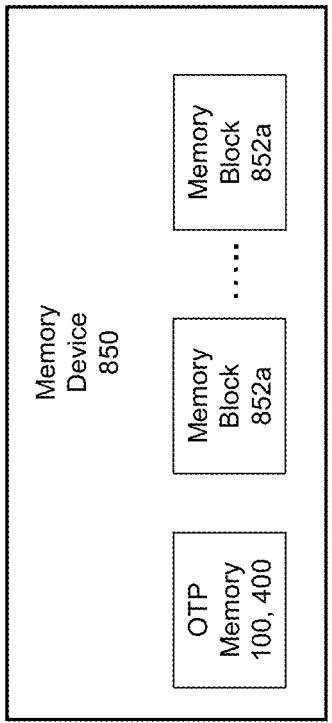
FIG. 8B is a block diagram of a memory device that may include an OTP memory, according to one or more embodiments.
Figure 8A:
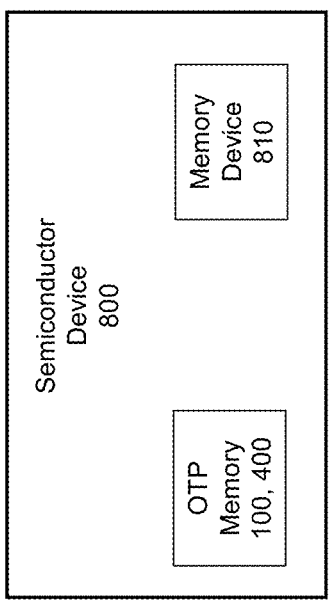
FIG. 8A is a block diagram of a semiconductor device that may include the OTP memory, according to one or more embodiments.

FIGS. 8A-8B illustrate exemplary implementations of the OTP memory 100 and/or OTP memory 400 (e.g., OTP memory 100, 400), according to one or more embodiments. In particular, FIG. 8A illustrates a semiconductor device 800 that may include the OTP memory 100, 400, according to one or more embodiments. The semiconductor device 800 may include, for example, a semiconductor die (e.g., semiconductor chip), or a system assembly such as an SOC assembly or a system on integrated chip (SoIC) assembly. The OTP memory 100, 400 may be used as an electronic fuse (eFuse) memory for the semiconductor device 800. In particular, the OTP memory 100, 400 may store global information for the semiconductor device 800.

The semiconductor device 800 may also include a memory device 810 (e.g., associated memory). The memory device 810 may include, for example, a PCRAM device, RRAM device, FeRAM device or CBRAM device. The memory cells 102 of the OTP memory 100 and/or the memory cells 402 of the OTP memory 400 (e.g., memory cells 102, 402) may be similar in structure to the memory cells of the memory device 810. That is, a material and/or structure of the memory cells 102, 402 of the OTP memory 100, 400 may be similar to a material and/or structure of the memory cells in the memory device 810 (e.g., PCRAM data storage material, RRAM data storage material, FeRAM data storage material, CBRAM data storage material, etc.). For example, both the OTP memory 100, 400 and the memory device 810 may include a 3D cross-point design (e.g., see FIGS. 3 and 6). As a result, the OTP memory 100, 400 may be fabricated together with the memory device 810 without necessarily requiring any extra processing steps (e.g., extra masks).

In at least one embodiment, the semiconductor device 800 may include the memory device 810 having a plurality of memory device memory cells (e.g., associated memory), each memory device memory cell of the plurality of memory device memory cells including a memory device selector, and the OTP memory 100, 400 having a plurality of memory cells 102, 402, each memory cell of the plurality of memory cells 102, 402 including a selector 102a substantially the same as the memory device selector. The memory device selector may include a first material and the selector 102a may include a second material substantially the same as the first material.

Further, in the case where the semiconductor device 800 includes OTP memory 100, then each memory device memory cell of the plurality of memory device memory cells in the memory device 810 (e.g., associated memory) may further include a memory device resistive element connected in series with the memory device selector, and each memory cell 102 of the plurality of memory cells 102 in the OTP memory 100 may further include a resistive element 102b connected in series with the selector 102a and substantially the same as the memory device resistive element. In particular, the memory device resistive element of the memory device 810 may include a third material, and the resistive element 102b of the OTP memory 100 may include a fourth material substantially the same as the third material.

FIG. 8B illustrates a memory device 850 that may include an OTP memory 100, 400, according to one or more embodiments. The memory device 850 may be substantially similar to the memory device 810 illustrated in FIG. 8A. The memory device 850 may include, for example, a PCRAM device, RRAM device, FeRAM device or CBRAM device.

The OTP memory 100, 400 may be used as an information block of the memory device 850. In particular, the OTP memory 100, 400 may store information dedicated to the memory device 850. The memory device 850 may include one or more memory blocks 852a that may store data in the memory device 850. The memory cells 102, 402 of the OTP memory 100, 400 may be similar in structure to the memory cells of the memory blocks 852a of the memory device 850. That is, a material and/or structure of the memory cells 102, 402 of the OTP memory 100, 400 may be similar to a material and/or structure of the memory cells in the memory blocks 852a (e.g., PCRAM data storage material, RRAM data storage material, FeRAM data storage material, CBRAM data storage material, etc.). For example, both the OTP memory 100, 400 and the memory blocks 852a may include a 3D cross-point design (e.g., see FIGS. 3 and 6). As a result, the OTP memory 100, 400 may be fabricated together with the memory blocks 852a without necessarily requiring any extra processing steps (e.g., extra masks).

In at least one embodiment, the memory device 850 may include the memory blocks 852 having a plurality of memory block memory cells, each memory block memory cell of the plurality of memory block memory cells including a memory block selector, and the OTP memory 100, 400 having a plurality of memory cells 102, 402, each memory cell of the plurality of memory cells 102, 402 including a selector 102a, substantially the same as the memory block selector. The memory block selector may include a first material and the selector 102a may include a second material substantially the same as the first material.

Further, in the case where the memory device 850 includes OTP memory 100, then each memory block memory cell of the plurality of memory block memory cells in the memory blocks 852a may further include a memory block resistive element connected in series with the memory block selector, and each memory cell 102 of the plurality of memory cells 102 in the OTP memory 100 may further include a resistive element 102b connected in series with the selector 102a and substantially the same as the memory block resistive element. In particular, the memory block resistive element of the memory device may include a third material, and the resistive element 102b of the OTP memory 100 may include a fourth material substantially the same as the third material.

Referring to FIGS. 1A-8B, a one-time programmable (OTP) memory 100, 400 may include a plurality of bit lines 112, a plurality of word lines 106, and a plurality of memory cells 102, 402. Each memory cell 102 of the plurality of memory cells 102, 402 may include a first terminal 102c1 coupled to a bit line 112 of the plurality of bit lines 112, a second terminal 102c2 coupled to a word line 106 of the plurality of word lines 106, and a selector 102a coupled between the first terminal 102c1 and the second terminal 102c2 and having a threshold voltage Vth that may be alterable by an electric current. The OTP memory may include an eFuse memory of a semiconductor device including associated memory that is associated with the eFuse memory. The selector 102a may include one of an ovonic threshold switch or a diode. The ovonic threshold switch may include a layer of phase change material. The memory cell 102 may further include a resistive element 102b coupled in series with the selector 102a between the first terminal 102c1 and the second terminal 102c2 and having a resistance that may be alterable by an electric current. The resistive element 102b may be coupled between the first terminal 102c1 and the selector 102a, and the selector 102a may be coupled between the second terminal 102c2 and the resistive element 102b. The resistive element 102b may include one of a phase change random access memory (PCRAM) data storage material, a resistive random access memory (RRAM) data storage material, a ferroelectric random access memory (FeRAM) data storage material or a conductive bridging random access memory (CBRAM) data storage material. The selector 102a may cooperate with the resistive element 102b to store data, and may inhibit generation of a leakage current from the memory cell 102 when the memory cell is not selected. The selector 102a may include a first plurality of layers, and the resistive element 102b may include a second plurality of layers that are stacked on the first plurality of layers. The OTP memory 100, 400 may include a three-dimensional cross-point structure. The three-dimensional cross-point structure may include a plurality of first level memory cells 102L1, 402L1, and a plurality of second level memory cells 102L2, 402L2 vertically stacked on the plurality of first level memory cells 102L1, 402L1, respectively. The OTP memory 100, 400 may further include a plurality of bit line select switches 113 for selecting a bit line 112 of the plurality of bit lines 112, a plurality of word line select switches 107 for selecting a word line 106 of the plurality of word lines 106, and a plurality of sense amplifiers 114 connected to the plurality of bit lines 112, respectively, for sensing a current on the plurality of bit lines 112, respectively. A cell area of each memory cell 102, 402 in the plurality of memory cells 102, 402 may be in a range from 25 nm2 to 2500 nm2.

Referring to FIGS. 1A-8B, a method of operating a one-time programmable (OTP) memory 100, 400 including a plurality of memory cells 102, 402, each memory cell 102 of the plurality of memory cells 102, 402 including a first terminal 102c1, a second terminal 102c2 and a selector 102a connected between the first terminal 102c1 and the second terminal 102c2, may include performing a write operation including supplying a first write voltage Vg to the first terminal 102c1 of a selected memory cell 102C and a second write voltage −Vg to the second terminal 102c2 of the selected memory cell 102C so as to decrease a threshold voltage Vth of the selector 102a of the selected memory cell 102C from a first threshold value Vth1 to a second threshold value Vth2, wherein a difference between the first write voltage Vg and the second write voltage−Vg may be greater than the first threshold value Vth1, and performing a read operation including supplying a first read voltage Vr to the first terminal 102c1 and a second read voltage−Vr to the second terminal 102c2 of the selected memory cell 102C, so that a logic state of the selected memory cell 102C may be sensible, wherein a difference between the first read voltage Vr and the second read voltage−Vr may be less than the first threshold value Vth1 and greater than the second threshold value Vth2. The performing of the read operation may further include sensing a current in a bit line 112 of the OTP memory 100, 400 generated by the supplying of the first read voltage Vr to the first terminal 102c1 and the second read voltage−Vr to the second terminal 102c2. Each memory cell 102, 402 of the plurality of memory cells 102, 402 may further include a resistive element 102b connected in series with the selector 102a between the first terminal 102c1 and the second terminal 102c2, and the performing of the write operation may further include supplying a third write voltage Vg,set to the first terminal 102c1 and a fourth write voltage−Vg,set to the second terminal 102c2, so as to cause the resistive element 102b of the selected memory cell to be in a low resistance state, wherein a difference between the third write voltage Vg,set and the fourth write voltage−Vg, set may be less than the first threshold value Vth1 and greater than the second threshold value Vth2. Each memory cell 102, 402 of the plurality of memory cells 102, 402 may further include a resistive element 102b connected in series with the selector 102a between the first terminal 102c1 and the second terminal 102c2, and the supplying of the first write voltage Vg to the first terminal 102c1 of a selected memory cell 102C and the second write voltage−Vg to the second terminal 102c2 of the selected memory cell 102C may cause the resistive element 102b of the selected memory cell 102C to be in a low resistance state.

Referring to FIGS. 1A-8B, a semiconductor device 800 may include a memory device 810 including a plurality of memory device memory cells, each memory device memory cell of the plurality of memory device memory cells including a memory device selector 102a, and a one-time programmable (OTP) memory 100, 400 including a plurality of memory cells 102, 402, each memory cell 102, 402 of the plurality of memory cells 102, 402 including a selector 102a substantially the same as the memory device selector. The memory device selector may include a first material and the selector 102a may include a second material substantially the same as the first material. Each memory device memory cell of the plurality of memory device memory cells may further include a memory device resistive element connected in series with the memory device selector, and each memory cell 102, 402 of the plurality of memory cells 102, 402 in the OTP memory 100, 400 may further include a resistive element 102b connected in series with the selector 102a and substantially the same as the memory device resistive element. The memory device resistive element of the memory device 810 may include a third material, and the resistive element 102b of the OTP memory 100, 400 may include a fourth material substantially the same as the third material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A one-time programmable (OTP) memory, comprising:
    a plurality of bit lines;
    a plurality of word lines; and
    a plurality of memory cells, each memory cell of the plurality of memory cells comprising:
        a first terminal coupled to a bit line of the plurality of bit lines;
        a second terminal coupled to a word line of the plurality of word lines; and
        a selector connected directly to the first terminal and directly to the second terminal and having a threshold voltage that is alterable by an electric current, wherein the OTP memory comprises an information block of a memory device and is configured to store information dedicated to the memory device, and each of the OTP memory and the memory device comprises a three-dimensional cross-point structure including a plurality of first level memory cells and a plurality of second level memory cells vertically stacked on the plurality of first level memory cells, respectively.

2. The OTP memory of claim 1, wherein the OTP memory comprises an eFuse memory of the memory device.

3. The OTP memory of claim 2, wherein the associated memory of the semiconductor device comprises one selector and one resistive element (1S1R) memory cells.

4. The OTP memory of claim 3, wherein a material of the selector of the OTP memory is substantially the same as a material of the selector of the associated memory.

5. The OTP memory of claim 1, wherein the selector comprises one of a diode or an ovonic threshold switch comprising a layer of phase change material.

6. The OTP memory of claim 1, further comprising:
    a plurality of bit line select switches for selecting a bit line of the plurality of bit lines;
    a plurality of word line select switches for selecting a word line of the plurality of word lines; and
    a plurality of sense amplifiers connected to the plurality of bit lines, for sensing a current on the plurality of bit lines, respectively.

7. The OTP memory of claim 1, wherein a cell area of each memory cell in the plurality of memory cells is in a range from 25 nm$^2$ to 2500 nm$^2$.

8. The OTP memory of claim 1, wherein the selector comprises:
    a lower barrier layer;
    a phase-change material layer on the lower barrier layer; and
    an upper barrier layer on the phase-change material layer.

9. The OTP memory of claim 1, wherein the first terminal comprises an upper conductive material layer formed on the upper barrier layer, the second terminal comprises a lower conductive material layer, and the lower barrier layer is on the lower conductive material layer.

10. The OTP memory of claim 1, wherein the selector is configured to have a first threshold voltage in a range from 2.5 V to 4.5 V and a second threshold voltage in a range from 0.1 V to 1.8 V.

11. The OTP memory of claim 1, wherein the selector is configured to have a threshold voltage that is decreased from the first threshold voltage to the second threshold voltage by performing a write operation on the selector.

12. The OTP memory of claim 1, wherein the selector is configured to be switched from a logic "0" state to a logic "1" state by performing a write operation on the selector.

13. The OTP memory of claim 1, wherein the first terminal is connected directly to the bit line and the second terminal connected direction to the word line.

14. The OTP memory of claim 1, wherein the selector comprises an ovonic threshold switch (OTS) comprising:
 a lower barrier layer;
 phase-change material layer on the lower barrier layer; and
 an upper barrier layer on the phase-change material layer.

15. The OTP memory of claim 1, wherein the first terminal of the memory cell comprises an upper conductive material layer on the upper barrier layer of the selector, the second terminal of the memory cell comprises a lower conductive material layer and the lower barrier layer of the selector is on the lower conductive material layer.

16. A method of operating a one-time programmable (OTP) memory, the method comprising:
 providing the OTP memory, wherein the OTP memory includes a plurality of memory cells, each memory cell of the plurality of memory cells comprising:
  a first terminal coupled to a bit line;
  a second terminal coupled to a word line; and
  a selector connected directly to the first terminal and directly to the second terminal, wherein the OTP memory comprises an information block of a memory device and is configured to store information dedicated to the memory device, and each of the OTP memory and the memory device comprises a three-dimensional cross-point structure including a plurality of first level memory cells and a plurality of second level memory cells vertically stacked on the plurality of first level memory cells, respectively;
 performing a write operation comprising supplying a first write voltage to the first terminal of a selected memory cell and a second write voltage to the second terminal of the selected memory cell so as to decrease a threshold voltage of the selector of the selected memory cell from a first threshold value to a second threshold value, wherein a difference between the first write voltage and the second write voltage is greater than the first threshold value; and
 performing a read operation comprising supplying a first read voltage to the first terminal and a second read voltage to the second terminal of the selected memory cell, so that a logic state of the selected memory cell is sensible, wherein a difference between the first read voltage and the second read voltage is less than the first threshold value and greater than the second threshold value.

17. The method of claim 16, wherein the performing of the read operation further comprises sensing a current in a bit line of the OTP memory generated by the supplying of the first read voltage to the first terminal and the second read voltage to the second terminal.

18. A semiconductor device comprising:
 a memory device including a plurality of memory device memory cells, each memory device memory cell of the plurality of memory device memory cells comprising a memory device selector; and
 a one-time programmable (OTP) memory including a plurality of memory cells, each memory cell of the plurality of memory cells comprising:
  a first terminal coupled to a bit line;
  a second terminal coupled to a word line;
  a selector connected directly to the first terminal and directly to the second terminal and substantially the same as the memory device selector, wherein the OTP memory comprises an information block of the memory device and is configured to store information dedicated to the memory device, and each of the OTP memory and the memory device comprises a three-dimensional cross-point structure including a plurality of first level memory cells and a plurality of second level memory cells vertically stacked on the plurality of first level memory cells, respectively.

19. The semiconductor device of claim 18, wherein the memory device selector comprises a first material and the selector comprises a second material substantially the same as the first material.

20. The semiconductor device of claim 18, wherein each memory device memory cell of the plurality of memory device memory cells further comprises a memory device resistive element connected in series with the memory device selector.

* * * * *